(12) United States Patent
Chen

(10) Patent No.: US 6,770,384 B2
(45) Date of Patent: Aug. 3, 2004

(54) LOW PRESSURE COATED ARTICLE WITH POLYMERIC BASECOAT HAVING THE APPEARANCE OF STAINLESS STEEL

(75) Inventor: Guocun Chen, Broomfield, CO (US)

(73) Assignee: Vapor Technologies, Inc., Longmont, CO (US)

( * ) Notice: Subject to any disclaimer, the term of this patent is extended or adjusted under 35 U.S.C. 154(b) by 70 days.

(21) Appl. No.: 10/034,017

(22) Filed: Dec. 19, 2001

(65) Prior Publication Data

US 2002/0146578 A1 Oct. 10, 2002

Related U.S. Application Data

(63) Continuation-in-part of application No. 09/827,193, filed on Apr. 5, 2001, now abandoned.

(51) Int. Cl.[7] .............................. B32B 15/04
(52) U.S. Cl. ................ 428/687; 428/472; 428/621; 428/627; 428/629; 428/632; 428/660; 428/663; 428/698; 428/699; 428/702; 428/413; 428/423.1; 428/469; 428/622; 428/623; 428/628; 428/661; 428/666; 428/701; 428/704
(58) Field of Search ................ 428/687, 472, 428/621, 627, 629, 632, 660, 663, 698, 699, 702, 413, 423.1, 469, 622, 623, 628, 661, 666, 701, 704

(56) References Cited

U.S. PATENT DOCUMENTS

| | | | | |
|---|---|---|---|---|
| 5,879,532 A | * | 3/1999 | Foster et al. | 205/192 |
| 6,154,311 A | * | 11/2000 | Simmons et al. | 359/359 |
| 6,168,242 B1 | * | 1/2001 | Mokerji | 428/412 |
| 6,170,487 B1 | * | 1/2001 | Ishiguro et al. | 128/897 |
| 6,196,936 B1 | * | 3/2001 | Meckel | 473/349 |
| 2002/0146577 A1 | * | 10/2002 | Chen | 428/457 |

* cited by examiner

*Primary Examiner*—Terrel Morris
*Assistant Examiner*—Andrew T Piziali
(74) *Attorney, Agent, or Firm*—Emch, Schaffer, Schaub & Porcello Co., L.P.A.

(57) ABSTRACT

An article is coated with a multi-layer decorative and protective coating having the appearance of stainless steel. The coating comprises a polymer basecoat layer on the surface of said article and vapor deposited at relatively low pressure on the polymer layer a protective and decorative color layer comprised of the reaction products of refractory metal or refractory metal alloy, nitrogen and oxygen wherein the nitrogen and oxygen content of the reaction products are each from about 4 to about 32 atomic percent with the nitrogen content being at least about 3 atomic percent.

14 Claims, 2 Drawing Sheets

LOW PRESSURE COATED ARTICLE WITH POLYMERIC BASECOAT HAVING THE APPEARANCE OF STAINLESS STEEL

RELATED APPLICATION

This application is a continuation-in-part application of application Ser. No. 09/827,193 filed Apr. 5, 2001 now abandoned.

FIELD OF THE INVENTION

This invention relates to articles, particularly brass articles, coated with a multi-layered decorative and protective coating having the appearance or color of stainless steel.

BACKGROUND OF THE INVENTION

It is currently the practice with various brass articles such as faucets, faucet escutcheons, door knobs, door handles, door escutcheons and the like to first buff and polish the surface of the article to a high gloss and to then apply a protective organic coating, such as one comprised of acrylics, urethanes, epoxies and the like, onto this polished surface. This system has the drawback that the buffing and polishing operation, particularly if the article is of a complex shape, is labor intensive. Also, the known organic coatings are not always as durable as desired, and are susceptible to attack by acids. It would, therefore, be quite advantageous if brass articles, or indeed other articles, either plastic, ceramic, or metallic, could be provided with a coating which provided the article with a decorative appearance as well as providing wear resistance, abrasion resistance and corrosion resistance. It is known in the art that a multi-layered coating can be applied to an article which provides a decorative appearance as well as providing wear resistance, abrasion resistance and corrosion resistance. This multi-layer coating includes a decorative and protective color layer of a refractory metal nitride such as a zirconium nitride or a titanium nitride. This color layer, when it is zirconium nitride, provides a brass color, and when it is titanium nitride provides a gold color.

U.S. Pat. Nos. 5,922,478; 6,033,790 and 5,654,108, inter alia, describe a coating which provides an article with a decorative color, such as polished brass, and also provides wear resistance, abrasion resistance and corrosion resistance. It would be very advantageous if a coating could be provided which provided substantially the same properties as the coatings containing zirconium nitride or titanium nitride but instead of being brass colored or gold colored was stainless steel colored. The present invention provides such a coating.

SUMMARY OF THE INVENTION

The present invention is directed to an article such as a plastic, ceramic or metallic article having a decorative and protective multi-layer coating deposited on at least a portion of its surface. More particularly, it is directed to an article or substrate, particularly a metallic article such as aluminum, brass or zinc, having deposited on its surface multiple superposed layers of certain specific types of materials. The coating is decorative and also provides corrosion resistance, wear resistance and abrasion resistance. The coating provides the appearance of stainless steel, i.e. has a stainless steel color tone. Thus, an article surface having the coating thereon simulates a stainless steel surface.

The article first has deposited on its surface a polymeric basecoat layer. On top of the polymeric basecoat layer is then deposited, by vapor deposition such as physical vapor deposition, one or more vapor deposited layers. More particularly, a first layer deposited directly on the surface of the substrate is comprised of a polymeric material. Over the polymeric layer is vapor deposited at relatively low pressure a protective and decorative color layer comprised of the reaction products of a refractory metal or refractory metal alloy, nitrogen and oxygen, wherein the oxygen and nitrogen content are low, i.e., substoichiometric. The total oxygen and nitrogen content of the reaction products of refractory metal, nitrogen and oxygen or reaction products of refractory metal alloy, nitrogen and oxygen is from about 4 to about 32 atomic percent with a nitrogen content of at least about 3 atomic percent, preferably between about 5 to about 28 atomic percent with a nitrogen content of at least about 4 atomic percent. The protective color layer is deposited at relatively low pressures in the vacuum coating chamber. These relatively low pressures are generally below about 8 millitorr, preferably below about 5 millitorr, and more preferably below about 3 millitorr. This low pressure deposition provides a protective color layer exhibiting improved mechanical properties, particularly improved abrasion resistance, and improved corrosion resistance.

The slightly nitrided and oxidized color layer is mainly comprised of amorphous metallic refractory metal with textured metal nitride phase. For example, zirconium nitride oriented in (111) plane and smaller than 50 nm in grain size, or metallic zirconium oriented in (112) plane and smaller than 80 nm, depending on the proportion of oxygen in total gas flow. Such types of structures are produced at relatively low processing pressures, ranging from 1 to 5 millitorr. The color of the coating can be adjusted slightly bluish or yellowish by increasing or decreasing the oxygen to nitrogen ratio.

DESCRIPTION OF THE PREFERRED EMBODIMENT

The article or substrate 12 can be comprised of any material onto which a plated layer can be applied, such as plastic, e.g., ABS, polyolefin, polyvinylchloride, and phenolformaldehyde, ceramic, metal or metal alloy. In one embodiment it is comprised of a metal or metallic alloy such as copper, steel, brass, zinc, aluminum, nickel alloys and the like.

Figure 1:
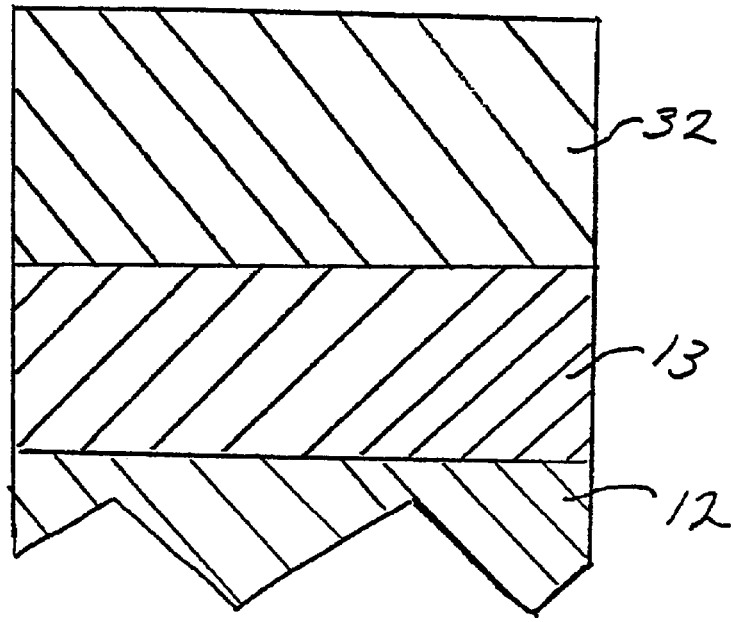
FIG. 1 is a cross sectional view, not to scale, of a portion of the substrate having a multi-layer coating comprising a polymeric basecoat layer and a color layer comprised of the reaction products of a refractory metal or refractory metal alloy, nitrogen and oxygen directly on the polymeric layer.
Figure 2:
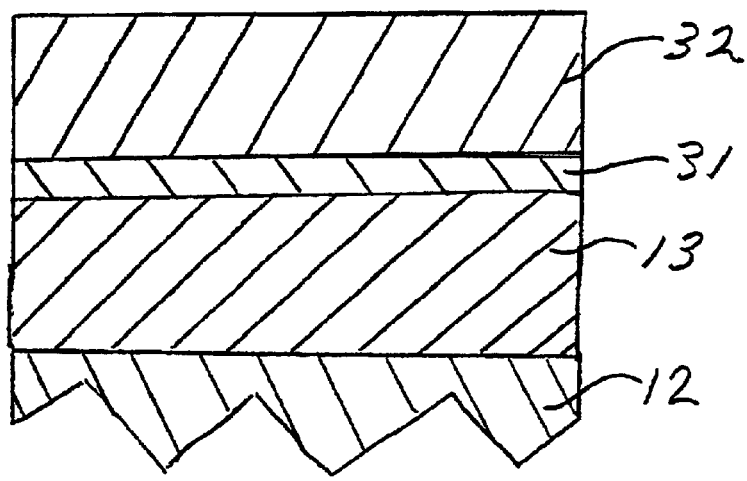
FIG. 2 is a view similar to FIG. 1 except that a refractory metal or refractory metal alloy strike layer is present intermediate the basecoat layer and the color layer.
Figure 3:
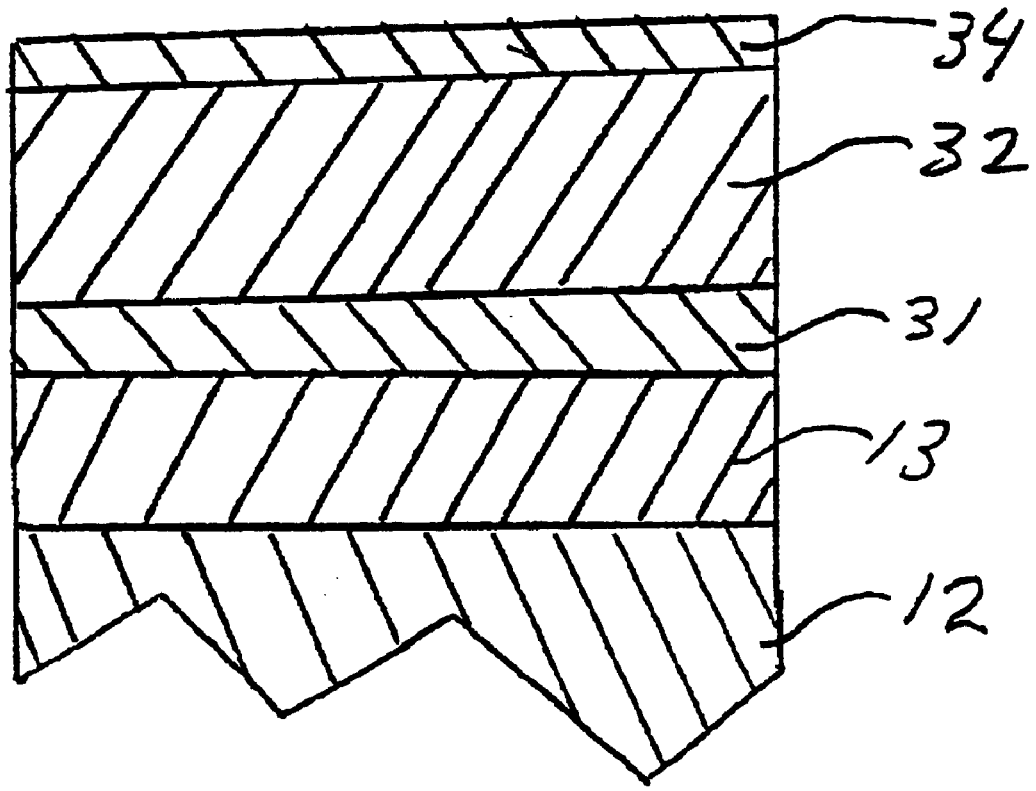
FIG. 3 is a view similar to FIG. 2 except that a refractory metal oxide or a refractory metal alloy oxide layer is present on the color layer.

In the instant invention, as illustrated in FIGS. 1–3, a polymeric or resinous basecoat layer 13 is applied onto the surface of the article. Over the polymer layer 13 is applied a refractory metal compound or refractory metal alloy compound color layer 32 by vapor deposition. The polymeric layer serves, inter alia, as a basecoat which smoothes and covers any scratches or imperfections in the surface of the article. The polymeric basecoat layer 13 may be comprised of both thermoplastic and thermoset polymeric or resinous material. These polymeric or resinous materials include the well known, conventional and commercially available polycarbonates, epoxy urethanes, polyacrylates, polymethacrylates, nylons, polyesters, polypropylenes, polyepoxies, alkyds and styrene containing polymers such as polystyrene, styrene-acrylonitrile (SAN), styrene-butadiene, acrylonitrile-butadiene-styrene (ABS), and blends and copolymers thereof.

The polycarbonates are described in U.S. Pat. Nos. 4,579,910 and 4,513,037, both of which are incorporated herein by reference.

Nylons are polyamides which can be prepared by the reaction of diamines with dicarboxylic acids. The diamines and dicarboxylic acids which are generally utilized in preparing nylons generally contain from two to about 12 carbon atoms. Nylons can also be prepared by additional polymerization. They are described in "Polyamide Resins", D. E. Floyd, Reinhold Publishing Corp., New York, 1958, which is incorporated herein by reference.

The polyepoxies are disclosed in "Epoxy Resins", by H. Lee and K. Nevill, McGraw-Hill, New York, 1957, and in U.S. Pat. Nos. 2,633,458; 4,988,572; 4,680,076; 4,933,429 and 4,999,388, all of which are incorporated herein by reference.

The polyesters are polycondensation products of an aromatic dicarboxylic acid and dihydric alcohol. The aromic dicarboxylic acids include terephthalic acid, isophthalic acid, 4,4'-diphenyl-dicarboxylic acid, 2,6-naphthalenedicarboxylic acid, and the like. Dihydric alcohols include the lower alkane diols with from two to about 10 carbon atoms such as, for example, ethylene glycol, propylene glycol, cyclohexanedimethanol, and the like. Some illustrative non-limiting examples of polyesters include polyethylene terephthalate, polybutylene terephthalate, polyethylene isophthalate, and poly(1,4-cyclohexanedimethylene terephthalate). They are disclosed in U.S. Pat. Nos. 1,465,319; 2,901,466 and 3,047,539, all of which are incorporated herein by reference.

The polyacrylates and polymethacrylates are polymers or resins resulting from the polymerization of one or more acrylates such as, for example, methyl acrylate, ethyl acrylate, butyl acrylate, 2-ethylhexyl acrylate, etc., as well as the methacrylates such as, for instance, methyl methacrylate, ethyl methacrylate, butyl methacrylate, hexyl methacrylate, etc. Copolymers of the above acrylate and methacrylate monomers are also included within the term "polyacrylates" or "polymethacrylates" as it appears therein. The polymerization of the monomeric acrylates and methacrylates to provide the polyacrylate resins useful in the practice of the invention may be accomplished by any of the well known polymerization techniques.

The styrene-acrylonitrile and acrylonitrile-butadiene-styrene resins and their preparation are disclosed, inter alia, in U.S. Pat. Nos. 2,769,804; 2,989,517; 2,739,142; 3,991,136 and 4,387,179, all of which are incorporated herein by reference.

The alkyd resins are disclosed in "Alkyd Resin Technology", Patton, Interscience Publishers, NY, N.Y., 1962, and in U.S. Pat. Nos. 3,102,866; 3,228,787 and 4,511,692, all of which are incorporated herein by reference.

The epoxy urethanes and their preparation are disclosed, inter alia, in U.S. Pat. Nos. 3,963,663; 4,705,841; 4,035,274; 4,052,280; 4,066,523; 4,159,233; 4,163,809; 4,229,335 and 3,970,535, all of which are incorporated by reference. Particularly useful epoxy urethanes are those that are electrocoated onto the article. Such electrodepositable epoxy urethanes are described in the aforementioned U.S. Pat. Nos. 3,963,663; 4,066,523; 4,159,233; 4,035,274 and 4,070,258.

These polymeric materials may optionally contain the conventional and well known fillers such as mica, talc and glass fibers.

The polymeric basecoat layer 13 may be applied onto the surface of the substrate to, inter alia, cover any scratches or imperfections in the surface of the article and provide a smooth and even surface for the deposition of the succeeding layers such as the vapor deposited layers.

The polymeric basecoat layer 13 has a thickness at least effective to level out the surface of the article or substrate. Generally, this thickness is at least about 0.12 $\mu$m, preferably at least about 2.5 $\mu$m, and more preferably at least about 5 $\mu$m. The upper thickness range should not exceed about 250 $\mu$m.

In some instances, depending on the substrate material and the type of polymeric basecoat, the polymeric basecoat does not adhere sufficiently to the substrate. In such a situation a primer layer is deposited on the substrate to improve the adhesion of the polymeric basecoat to the substrate. The primer layer can be comprised, inter alia, of halogenated polyolefins. The halogenated polyolefins are conventional and well known polymers that are generally commercially available. The preferred halogenated polyolefins are the chlorinated and brominated polyolefins, with the chlorinated polyolefins being more preferred. The halogenated, particularly chlorinated, polyolefins along with methods for their preparation are disclosed, inter alia, in U.S. Pat. Nos. 5,319,032; 5,840,783; 5,385,979; 5,198,485; 5,863,646; 5,489,650 and 4,273,894, all of which are incorporated herein by reference.

The thickness of the primer layer is a thickness effective to improve the adhesion of the polymeric basecoat layer to the substrate. Generally this thickness is at lest about 0.25 $\mu$m. The upper thickness is not critical and generally is controlled by secondary considerations such as cost and appearance. Generally an upper thickness of about 125 $\mu$m should not be exceeded.

Over the polymeric basecoat layer is deposited, by vapor deposition such as physical vapor deposition and chemical vapor deposition at relatively low pressure, a protective and decorative color layer 32 comprised of reaction products of refractory metal, nitrogen and oxygen, or reaction products of refractory metal alloy, nitrogen and oxygen.

The reaction products of the refractory metal or refractory metal alloy, oxygen and nitrogen are generally comprised of the refractory metal oxide or refractory metal alloy oxide, refractory metal nitride or refractory metal alloy nitride, and refractory metal oxy-nitride or refractory metal alloy oxy-nitride. Thus, for example, the reaction products of zirconium, oxygen and nitrogen comprise zirconium oxide, zirconium nitride and zirconium oxy-nitride. These metal oxides and metal nitrides including zirconium oxide and zirconium nitride alloys and their preparation and deposition are conventional and well known, and are disclosed, inter alia, in U.S. Pat. No. 5,367,285, the disclosure of which is incorporated herein by reference.

This color layer 32 has a stainless steel color or tone which is due, inter alia, to the low, substoichiometric nitrogen and oxygen content of the reaction products of refractory metal, nitrogen and oxygen or reaction products of refractory metal alloy, nitrogen and oxygen. The total nitrogen and oxygen content is each from about 4 to about 32 atomic percent with the nitrogen content being at least about 3 atomic percent, preferably from about 5 to about 28 atomic percent with the nitrogen content being at least about 4 atomic percent. Thus, for example, the nitrogen content is 6 atomic percent and the oxygen content is 20 atomic percent, the nitrogen content is 8 atomic percent and the oxygen content is 8 atomic percent, the nitrogen content is 15 atomic percent and the oxygen content is 2 atomic percent. Oxygen is generally present in an amount of at least about 1 atomic percent.

The nitrogen content of these reaction products generally contributes, inter alia, to the coating having its stainless steel color. The nitrogen content is from at least about 3 atomic percent to about 22 atomic percent, preferably from at least about 4 atomic percent to about 16 atomic percent. The nitrogen content should not exceed about 22 atomic percent, preferably about 16 atomic percent, or the coating loses its stainless steel appearance and begins to have a nickel color. Thus, the nitrogen content is critical to the coating having a stainless steel color.

At relatively low pressures in the vapor deposition chamber, such as a physical vapor deposition chamber, this amount of nitrogen and oxygen produces a stainless steel colored coating with two types of structures: (1) mainly amorphous metallic refractory metal with textured metal nitride phase with nano-sized crystal grains preferentially oriented in a certain direction, and (2) highly textured nano-size grains of the metallic refractory metal preferentially oriented in a certain direction. When the layer is comprised of the reaction products of a refractory metal or refractory metal alloy, oxygen and nitrogen, a higher oxygen proportion in the total gas flow tends to produce the second type of structure. The oxygen proportion should be controlled such that the resultant amount of oxide is not significant and the brilliance of the coating is not reduced.

The relatively low processing pressures in the vapor deposition vacuum chamber are generally below about 8 millitorr, preferably below about 5 millitorr, and more preferably below about 3 millitorr. Thus, for example, processing pressures can range from about 1 to about 5 millitorr.

This low pressure deposition provides a coating which has improved mechanical properties, particularly abrasion resistance, and improved corrosion resistance.

In the protective and decorative color layer 32 comprised of the reaction products of a refractory metal or refractory metal alloy, nitrogen and oxygen, varying the amount of oxygen will make the stainless steel colored layer more bluish or yellowish. Increasing the oxygen content will make the color layer have a bluish tint. Lowering the oxygen content will make the color layer have a yellowish tint.

The thickness of this color and protective layer 32 is a thickness which is at least effective to provide the color of stainless steel and to provide abrasion resistance, scratch resistance, and wear resistance. Generally, this thickness is at least about 1,000 Å, preferably at least about 1,500 Å, and more preferably at least about 2,500 Å. The upper thickness range is generally not critical and is dependent upon secondary considerations such as cost. Generally a thickness of about 7,000 Å, preferably about 5,000 Å should not be exceeded.

One method of depositing layer 32 is by physical vapor deposition utilizing reactive sputtering or reactive cathodic arc evaporation. Reactive cathodic arc evaporation and reactive sputtering are generally similar to ordinary sputtering and cathodic arc evaporation except that a reactive gas is introduced into the chamber which reacts with the dislodged target material. Thus, in the case where layer 32 is comprised of the reaction products of zirconium, oxygen and nitrogen, the cathode is comprised of zirconium, and nitrogen and oxygen are the reactive gases introduced into the chamber.

In addition to the protective color layer 32 there may optionally be present additional vapor deposited layers. These additional vapor deposited layers may include a layer comprised of refractory metal or refractory metal alloy. The refractory metals include hafnium, tantalum, zirconium and titanium. The refractory metal alloys include zirconium-titanium alloy, zirconium-hafnium alloy and titanium-hafnium alloy. The refractory metal layer or refractory metal alloy layer 31 generally functions, inter alia, as a strike layer which improves the adhesion of the color layer 32 to the polymer layer. As illustrated in FIGS. 2–4, the refractory metal or refractory metal alloy strike layer 31 is generally disposed intermediate the color layer 32 and the polymer layer. Layer 31 has a thickness which is generally at least effective for layer 31 to function as a strike layer. Generally, this thickness is at least about 60 Å, preferably at least about 120 Å, and more preferably at least about 250 Å. The upper thickness range is not critical and is generally dependent upon considerations such as cost. Generally, however, layer 31 should not be thicker than about 1.2 $\mu$m, preferably about 0.5 $\mu$m, and more preferably about 0.25 $\mu$m.

The refractory metal or refractory metal alloy layer 31 is deposited by conventional and well known vapor deposition techniques including physical vapor deposition techniques such as cathodic arc evaporation (CAE) or sputtering. Sputtering techniques and equipment are disclosed, inter alia, in J. Vossen and W. Kern "Thin Film Processes II", Academic Press, 1991; R. Boxman et al, "Handbook of Vacuum Arc Science and Technology", Noyes Pub., 1995; and U.S. Pat. Nos. 4,162,954 and 4,591,418, all of which are incorporated herein by reference.

Briefly, in the sputtering deposition process a refractory metal (such as titanium or zirconium) target, which is the cathode, and the substrate are placed in a vacuum chamber. The air in the chamber is evacuated to produce vacuum conditions in the chamber. An inert gas, such as Argon, is introduced into the chamber. The gas particles are ionized and are accelerated to the target to dislodge titanium or zirconium atoms. The dislodged target material is then typically deposited as a coating film on the substrate.

In cathodic arc evaporation, an electric arc of typically several hundred amperes is struck on the surface of a metal cathode such as zirconium or titanium. The arc vaporizes the cathode material, which then condenses on the substrates forming a coating.

In a preferred embodiment of the present invention the refractory metal is comprised of titanium or zirconium, preferably zirconium, and the refractory metal alloy is comprised of zirconium-titanium alloy.

In addition to the protective color layer 32 there may optionally be present additional vapor deposited layers. The additional vapor deposited layers may include refractory metal compounds and refractory metal alloy compounds other than the above described oxy-nitrides. These refractory metal compounds and refractory metal alloy compounds include the refractory metal oxides and refractory metal alloy oxides; the refractory metal carbides and refractory metal alloy carbides; and the refractory metal carbonitrides and refractory metal alloy carbonitrides.

In one embodiment of the invention, as illustrated in FIG. 3, a layer 34 comprised of refractory metal oxide or refractory metal alloy oxide is disposed over color layer 32. The refractory metal oxides and refractory metal alloy oxides of which layer 34 is comprised include, but are not limited to, hafnium oxide, tantalum oxide, zirconium oxide, titanium oxide, and zirconium-titanium alloy oxide, preferably titanium oxide, zirconium oxide, and zirconium-titanium alloy oxide, and more preferably zirconium oxide. These oxides and their preparation are conventional and well known.

Layer 34 is effective in providing improved chemical, such as acid or base, resistance to the coating. Layer 34 containing a refractory metal oxide or a refractory metal alloy oxide generally has a thickness at least effective to provide improved chemical resistance. Generally this thickness is at least about 10 Å, preferably at least about 25 Å, and more preferably at least about 40 Å. Layer 34 should be thin enough so that it does not obscure the color of underlying color layer 32. That is to say layer 34 should be thin enough so that it is non-opaque or substantially transparent. Generally layer 34 should not be thicker than about 0.10 μm, preferably about 250 Å, and more preferably about 100 Å.

The stainless steel color of the coating can be controlled or predetermined by designated stainless steel color standard. The stainless steel color may be adjusted to be slightly more yellowish or bluish by an increase or decrease in nitrogen to oxygen ratio in total gas flow. Polished or brushed surface finish of stainless steels may be exactly matched.

In order that the invention may be more readily understood, the following example is provided. The example is illustrative and does not limit the invention thereto.

EXAMPLE

Brass faucets are placed in a conventional soak cleaner bath containing the standard and well known soaps, detergents, defloculants and the like which is maintained at a pH of 8.9–9.2 and a temperature of 180–200° F. for about 10 minutes. The brass faucets are then placed in a conventional ultrasonic alkaline cleaner bath. The ultrasonic cleaner bath has a pH of 8.9–9.2, is maintained at a temperature of about 160–180° F., and contains the conventional and well known soaps, detergents, defloculants and the like. After the ultrasonic cleaning the faucets are rinsed and dried.

A basecoat polymeric composition is applied onto the cleaned and dried faucets by a standard and conventional high volume low pressure gun. The polymer is comprised of 35 weight percent styrenated acrylic resin, 30 weight percent melamine formaldehyde resin, and 35 weight percent bisphenol A epoxy resin. The polymer is dissolved in sufficient solvents to provide a polymeric composition containing about 43 weight percent solids. After the basecoat is applied onto the faucets the faucets are allowed to sit for 20 minutes for ambient solvent flash off. The faucets are then baked at 375° F. for two hours. The resulting cured polymeric basecoat has a thickness of about 20 μm.

The polymeric basecoated faucets are placed in a cathodic arc evaporation plating vessel. The vessel is generally a cylindrical enclosure containing a vacuum chamber which is adapted to be evacuated by means of pumps. A source of argon gas is connected to the chamber by an adjustable valve for varying the rate of flow of argon into the chamber. In addition, sources of nitrogen and oxygen gases are connected to the chamber by adjustable valves for varying the rates of flow of nitrogen and oxygen into the chamber.

A cylindrical cathode is mounted in the center of the chamber and connected to negative outputs of a variable D.C. power supply. The positive side of the power supply is connected to the chamber wall. The cathode material comprises zirconium.

The polymeric basecoated faucets are mounted on spindles, 16 of which are mounted on a ring around the outside of the cathode. The entire ring rotates around the cathode while each spindle also rotates around its own axis, resulting in a so-called planetary motion which provides uniform exposure to the cathode for the multiple faucets mounted around each spindle. The ring typically rotates at several rpm, while each spindle makes several revolutions per ring revolution. The spindles are electrically isolated from the chamber and provided with rotatable contacts so that a bias voltage may be applied to the substrates during coating.

The vacuum chamber is evacuated to a pressure of about $10^{-5}$ to $10^{-7}$ torr and heated to about 100° C.

The polymeric basecoated faucets are then subjected to a high-bias arc plasma cleaning in which a (negative) bias voltage of about 500 volts is applied to the basecoated faucets while an arc of approximately 500 amperes is struck and sustained on the cathode. The duration of the cleaning is approximately five minutes.

Argon gas is introduced at a rate sufficient to maintain a pressure of about 1 to 5 millitorr. A layer of zirconium having an average thickness of about 0.1 μm is deposited on the polymeric basecoated faucets during a three minute period. The cathodic arc deposition process comprises applying D.C. power to the cathode to achieve a current flow of about 500 amps, introducing argon gas into the vessel to maintain the pressure in the vessel at about 1 to 5 millitorr and rotating the faucets in a planetary fashion described above.

After the zirconium layer is deposited a protective and decorative color layer comprised of the reaction products of zirconium, nitrogen and oxygen is deposited on the zirconium layer. A flow of nitrogen and oxygen is introduced into the vacuum chamber while the arc discharge continues at approximately 500 amperes. The flow rate of nitrogen and oxygen is a flow rate which will produce a color layer having a total nitrogen and oxygen content of about 6 to about 16 atomic percent. This flow of nitrogen and oxygen is about 4 to 20% of total flow of argon, nitrogen and oxygen. The flow is continued for about 20 to 35 minutes to form a color layer having a thickness of about 1,500 Å to 2,500 Å. After this color layer comprised of the reaction products of zirconium, nitrogen and oxygen is deposited the nitrogen flows are terminated and a flow of oxygen of approximately 20 to 80 standard liters per minute is continued for a time of about 10 to 60 seconds. A thin layer of zirconium oxide with a thickness of about 20 Å to 100 Å is formed. The arc is extinguished, the vacuum chamber is vented and the coated articles removed.

While certain embodiments of the invention have been described for purposes of illustration, it is to be understood that there may be various embodiments and modifications within the general scope of the invention.

I claim:

1. An article having on at least a portion of its surface a protective and decorative coating having the appearance of stainless steel comprising:

at least one layer comprised of polymer, vapor deposited at a low pressure of below 8 millitorr a color layer comprised of reaction products of refractory metal or refractory metal alloy, nitrogen and oxygen, wherein the total nitrogen and oxygen content of said reaction products of refractory metal or refractory metal alloy, nitrogen and oxygen is from about 4 to about 32 atomic percent with the nitrogen content being at least about 3 atomic percent, wherein the color layer has a structure comprised of (1) amorphous metallic refractory metal with oriented, textured nano-sized grains of a metal nitride phase or (2) oriented, textured, nano-sized grains, of metallic refractory metal.

2. The article of claim 1 wherein said total nitrogen and oxygen content is from about 5 to about 28 atomic percent with the nitrogen content being at least about 4 atomic percent.

3. The article of claim 1 wherein a layer comprised of refractory metal or refractory metal alloy is on said at least one layer comprised of nickel.

4. The article of claim 1 wherein a layer comprised of refractory metal oxide or refractory metal alloy oxide is on said color layer.

5. The article of claim 3 wherein a layer comprised of refractory metal oxide or refractory metal alloy oxide is on said color layer.

6. The article of claim 1 wherein said coating has the appearance of brushed stainless steel finish.

7. The article of claim 1 wherein said refractory metal is selected from the group consisting of zirconium, titanium and hafnium.

8. The article of claim 3 wherein said refractory metal is selected from the group consisting of zirconium, titanium and hafnium.

9. The article of claim 5 wherein said refractory metal is selected from the group consisting of zirconium, titanium and hafnium.

10. The article of claim 1 wherein said polymer is electrocoated on said article.

11. The article of claim 1 wherein said low pressure is below 5 millitorr.

12. The article of claim 11 wherein said low pressure is below 3 millitorr.

13. The article of claim 1 wherein the textured metal nitride is zirconium nitride oriented in a plane and smaller than 50 nm in grain size.

14. The article of claim 1 wherein the textured metallic refractory metal is zirconium oriented in a plane and smaller than 80 nm in grain size.

* * * * *